United States Patent [19]
Kometani et al.

[11] Patent Number: 5,748,549
[45] Date of Patent: May 5, 1998

[54] SEMICONDUCTOR MEMORY DEVICE

[75] Inventors: Osamu Kometani; Shoichi Wakano; Mikio Asakura, all of Hyogo, Japan

[73] Assignees: Mitsubishi Denki Kabushiki Kaisha; Mitsubishi Electric Engineering Co., Ltd., both of Tokyo, Japan

[21] Appl. No.: 735,835

[22] Filed: Oct. 23, 1996

[30] Foreign Application Priority Data

May 27, 1996 [JP] Japan .................................. 8-132015

[51] Int. Cl.$^6$ ........................................... G11C 5/14
[52] U.S. Cl. .......................... 365/226; 365/51; 365/63
[58] Field of Search .......................... 365/51, 63, 72, 365/226

[56] References Cited

U.S. PATENT DOCUMENTS 4,695,978  9/1987  Itakura ........................ 365/51
5,321,664  6/1994  Akimoto ...................... 365/51 X

FOREIGN PATENT DOCUMENTS 63-291460  11/1988  Japan .
2-97059    4/1990   Japan .
4-206659   7/1992   Japan .

*Primary Examiner*—Joseph A. Popek
*Attorney, Agent, or Firm*—McDermott, Will & Emery

[57] ABSTRACT

A first interconnection frame is provided on a semiconductor substrate so as to surround a central circuit strip. A second interconnection frame is provided on first metal interconnection frame with an insulating film therebetween. Both ends of a supply line are in contact with second interconnection frame. There is a gap provided between both ends of a ground line and second interconnection frame. Ground line and first interconnection frame are connected, using a via hole provided in the insulating film. Thus, an improved dynamic random access memory in which the voltage levels of supply lines and ground lines are stabilized is provided.

2 Claims, 11 Drawing Sheets

SEMICONDUCTOR MEMORY DEVICE

BACKGROUND OF THE INVENTION

1. Field of the Invention

The present invention relates generally to semiconductor memory devices, and more particularly to an improvement to stabilize the voltage level in a dynamic random access memory having a supply line and a ground line and having at least two metal interconnection layers. The present invention further relates to an improved dynamic random access memory with a reduced layout area.

2. Description of the Background Art

FIG. 12 is a schematic diagram showing a dynamic random access memory (hereinafter referred to as DRAM). On a semiconductor substrate (not shown), a row circuit strip and a column circuit strip cross each other. The portion at the crossing of the row circuit strip and the column circuit strip is called central circuit strip. Memory arrays are provided on both sides of the row circuit strip.

FIG. 13 is a plan view showing the central circuit strip of a conventional DRAM with two metal interconnection layers. FIG. 14 is a cross sectional view taken along line XIV—XIV in FIG. 13.

Referring to FIG. 13, central circuit strip 1 as will be described includes a circuit block 2 including a plurality of serial circuit cells. An interconnection strip 3 is provided between adjacent circuit blocks 2.

The structure of central circuit strip 1 will be detailed in conjunction with FIG. 14. The central circuit strip includes a semiconductor substrate 20. A first metal interconnection 6 is provided on semiconductor substrate 20 with an insulating film 21 interposed therebetween. Supply lines 4a and 4a' being formed of the second metal interconnection frame and ground lines 4b and 4b' being formed of the second metal interconnection frame are provided on first metal interconnection 6 with insulating film 21 therebetween. Supply lines 4a and 4a' are connected with first metal interconnection 6 by a via hole 5 provided in insulating film 21. The structure of interconnection strip 3 will be described later.

The conventional DRAM having the central circuit strip with such a structure is encountered with the following problem.

FIG. 15 is a plan view showing further in detail circuit blocks 2 and interconnection strip 3. (First metal interconnection 6 is not shown for readiness of illustration). Circuit block 2 includes a plurality of serial circuit cells 23. Supply line 4a and ground line 4b are provided across circuit block 2.

Inside interconnection strip 3 interconnection 30 connecting the terminals of circuit cells 23 is provided. In the figure, an interconnection 30a extending in the Y-direction is formed of a first metal interconnection. An interconnection 30b extending in the X-direction in the figure is formed of a second metal interconnection.

Referring to FIGS. 13 and 15, according to conventional techniques, first metal interconnection 6 to connect supply line 4a and supply line 4a' is provided avoiding first metal interconnection 30 provided in interconnection strip 3. It is therefore difficult to provide many such first metal interconnections 6, and to keep the voltage level of supply line 4a stable. More specifically, voltage at a portion close to the power supply of supply line 4a may be different from voltage at a portion away from the power supply. Ground line 4b is also encountered with the same problem.

SUMMARY OF THE INVENTION

The present invention is directed to a solution to the above-described problem, and provides an improved semiconductor memory device capable of keeping the voltage levels of a power supply line and a ground line in a stable state, in a semiconductor memory device including a central circuit strip.

Another object of the present invention is to provide an improved semiconductor memory device having a reduced layout area in the central circuit strip.

A semiconductor memory device according to a first aspect of the invention includes a central circuit strip, the portion at the crossing of a row circuit strip between memory array blocks and having an arrangement of circuit cells in the lengthwise direction of the chip and a column circuit strip between memory array blocks and having an arrangement of circuit cells along the shorter side of the chip. The central circuit strip includes a semiconductor substrate. A first interconnection frame is provided to surround the central circuit strip on the semiconductor substrate and along the edge of the central circuit strip. The first interconnection frame is formed of the first metal interconnection layer on the semiconductor substrate. A second interconnection frame is provided on the first interconnection frame with an insulating film therebetween. The second interconnection frame is provided to surround the central circuit strip along the edge of the central circuit strip. The second interconnection frame is formed of the second metal interconnection layer on the semiconductor substrate. In the central circuit strip, a supply line extends in parallel to the interconnection strip in the central circuit strip. The supply line is formed of a second metal interconnection layer. A ground line extending in parallel to the supply line is provided in the central circuit strip. The ground line is formed of the second metal interconnection. The both ends of the supply line are in contact with the second interconnection frame. There is a gap between both ends of the ground line and the second interconnection frame in order to avoid their electrical connection. The ground line and the first interconnection frame are connected by a via hole.

A semiconductor memory device according to a second aspect of the invention includes a central circuit strip, the portion at the crossing of a row circuit strip and a column circuit strip. The central circuit strip includes a semiconductor substrate. A first interconnection frame is provided to surround the central circuit strip on the semiconductor substrate and along the edge of the central circuit strip. The first interconnection frame is formed of the first metal interconnection layer. A second interconnection frame is provided on the first interconnection frame with an insulating film therebetween and along the edge of the central circuit strip. The second interconnection frame is provided to surround the central circuit strip. The second interconnection frame is formed of the second metal interconnection layer. In the central circuit strip a supply line is provided, which extends in parallel to an interconnection strip in the central circuit strip. The supply line is formed of the second metal interconnection layer. A ground line provided in the central circuit strip extends in parallel to the supply line. The ground line is formed of the second metal interconnection layer. Both ends of the ground line are in contact with the second interconnection frame. There is a gap provided between both ends of the supply line and the second interconnection frame, in order to avoid their electrical connection. The supply line and the first interconnection frame are connected by a via hole.

A semiconductor memory device according to a third aspect of the present invention includes a central circuit strip, the portion at the crossing of a row circuit strip and a column circuit strip. A bundle of signal lines passed through the central circuit strip extend linearly along the shorter sides of the chip.

A semiconductor memory device according to a fourth aspect of the present invention includes a central circuit strip, the portion at the crossing of a row circuit strip and a column circuit strip. A bundle of signal lines passed through the center circuit strip extend linearly along the longer sides of the chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described in conjunction with the accompanying drawings.

First Embodiment

Figure 1:
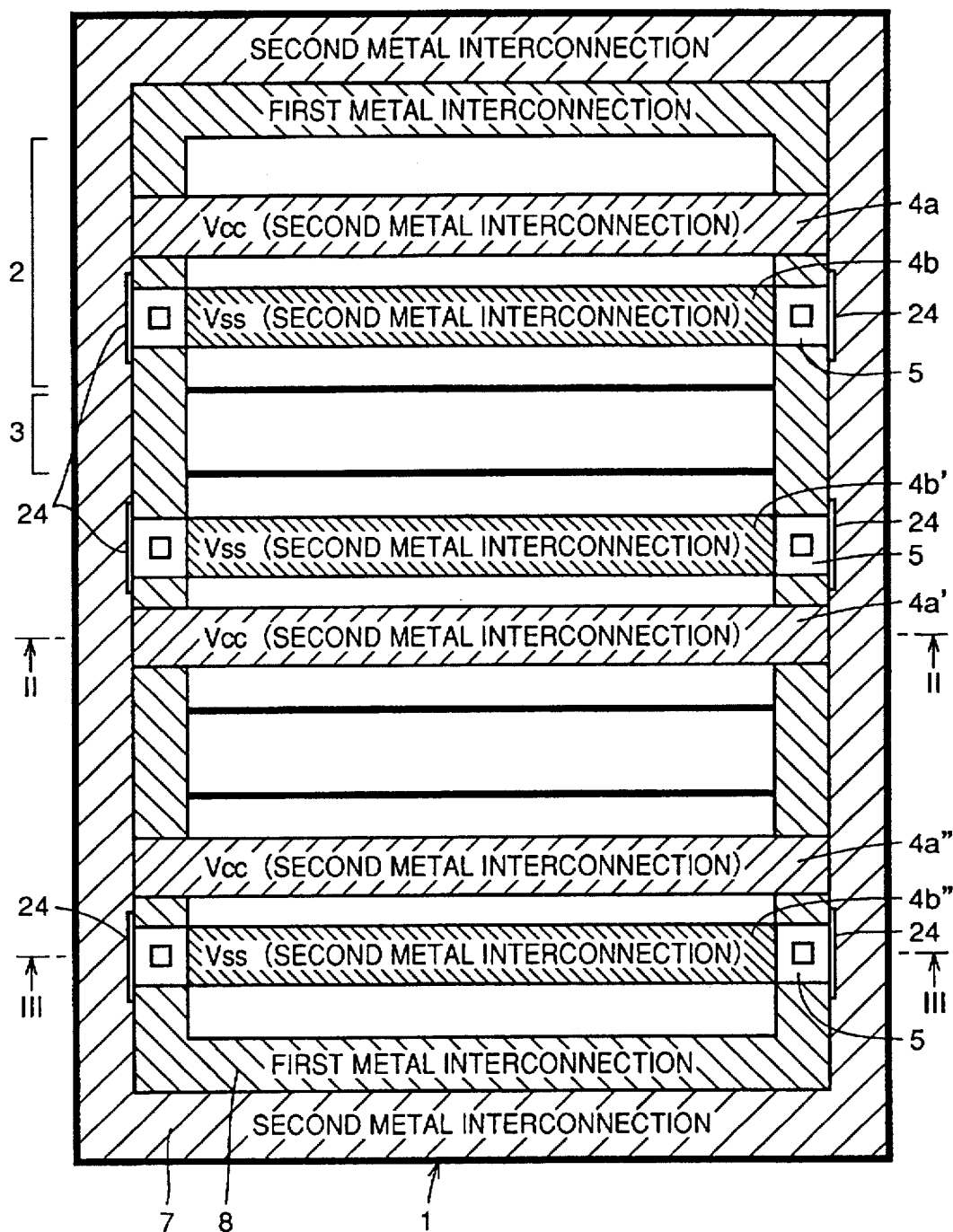
FIG. 1 is a plan view showing a central circuit strip in a DRAM according to a first embodiment of the invention.
Figure 2:
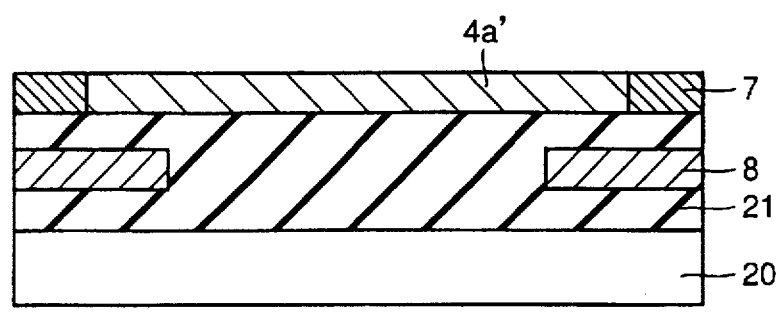
FIG. 2 is a cross sectional view taken along line II—II in FIG. 1.
Figure 3:
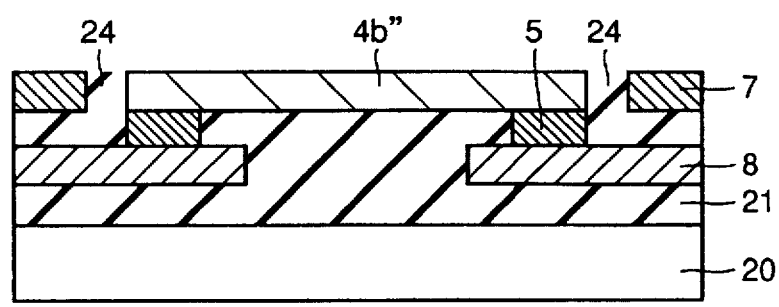
FIG. 3 is a cross sectional view taken along line III—III in FIG. 1.

FIG. 1 is a plan view showing a central circuit strip in a DRAM according to a first embodiment of the invention. FIG. 2 is a cross sectional taken along line II—II in FIG. 1. FIG. 3 is a cross sectional view taken along line III—III in FIG. 1. Referring to FIGS. 1 to 3, central circuit strip 1 includes a semiconductor substrate 20. A first interconnection frame 8 is provided on semiconductor substrate 20 and along the edge of central circuit strip 1, to surround central circuit strip 1. First interconnection frame 8 is formed of the first metal interconnection layer on the semiconductor substrate 20. A second interconnection frame 7 is provided on first interconnection frame 8 with an insulating film 21 therebetween. Second interconnection frame 7 is provided along the edge of central circuit strip 1 to surround central circuit strip 1. Second interconnection frame 7 is provided on the first interconnection frame with the insulating film therebetween and is formed of the second metal interconnection layer. In general, a metal interconnection layer is formed of aluminum or tungsten. The metal interconnection may be formed of Cu or Pt. A supply 4a' is provided in central circuit strip 1. Supply line 4a' is formed of the second metal interconnection layer from the surface of semiconductor substrate 20. Supply line 4a' extends in parallel to an interconnection strip 3 provided in central circuit strip 1. A ground line 4b" is provided in central circuit strip 1. Ground line 4b" is formed of the second metal interconnection layer from the surface of semiconductor substrate 20. Both ends of supply line 4a' are in contact with second interconnection frame 7. There is a gap 24 provided between both ends of ground line 4b" and second interconnection frame 7, in order to avoid their electrical connection. Ground line 4b" and second interconnection frame 7 are connected by a via hole 5.

In the first embodiment, second interconnection frame 7 surrounding central circuit strip 1 is connected with supply lines 4a, 4a' and 4a", and thus second interconnection frame 7 may be used as a supply line, the voltage level of the supply lines may be stabilized. In addition, first interconnection frame 8 provided surrounding central circuit strip 1 is connected to ground line 4b, 4b', and 4", thus first interconnection frame 8 may be used as a ground line, and therefore the voltage level of the ground line may be stabilized.

Second Embodiment

Figure 4:
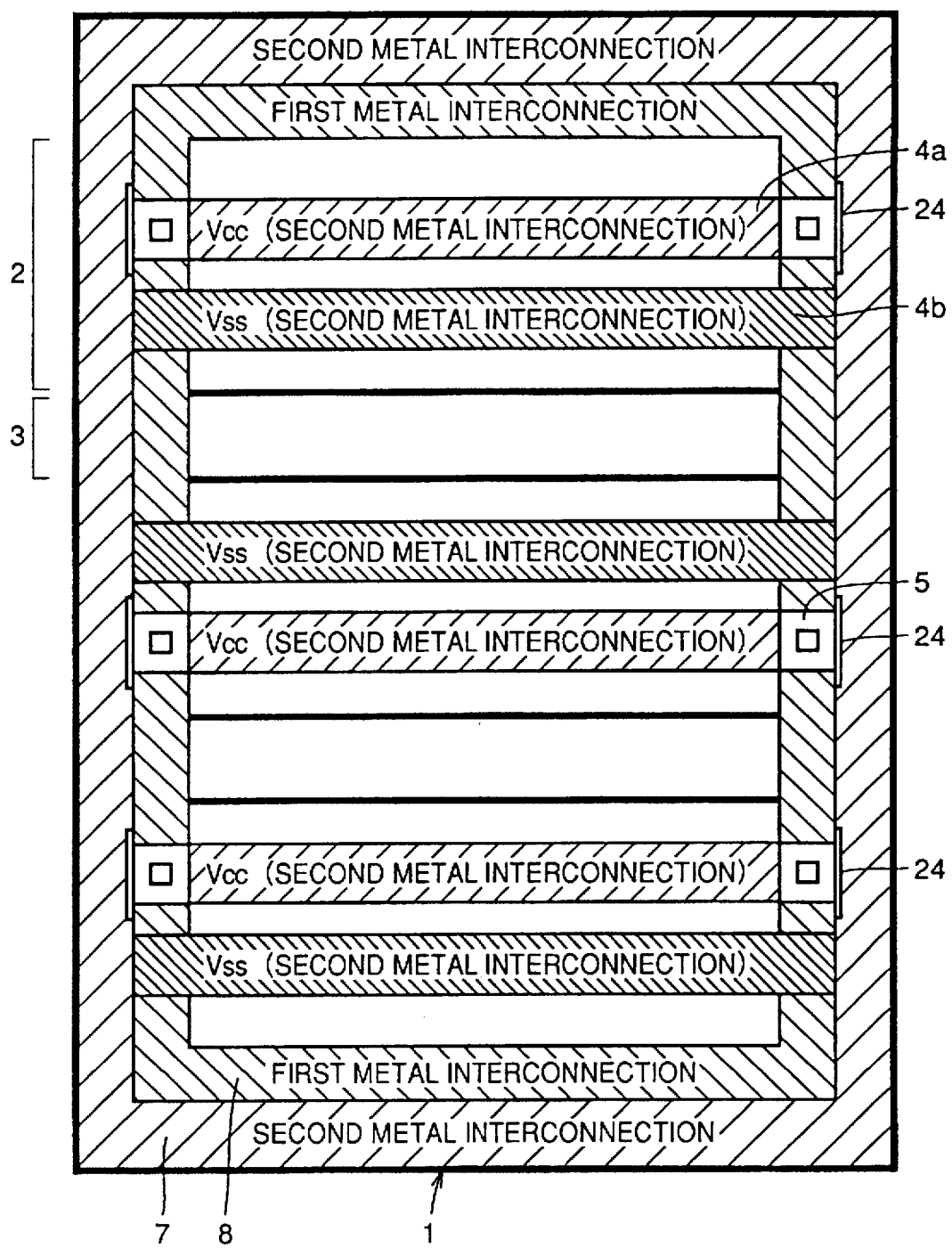
FIG. 4 is a plan view showing a central circuit strip in a DRAM according to a second embodiment of the invention.

FIG. 4 is a plan view showing a central circuit strip in a DRAM according to a second embodiment of the invention. A central circuit strip shown in FIG. 4 is the same as the central circuit strip shown in FIG. 1 with the following difference, and therefore the same or corresponding portions are denoted with the same reference numerals and characters, with description thereof will not be given here.

The central circuit strip shown in FIG. 4 is different from the central circuit strip shown in FIG. 1 in the following points. Both ends of ground line 4b are in contact with second interconnection frame 7. There is a gap 24 provided between both ends of supply line 4a and second interconnection frame 7, in order to avoid electrical connection therebetween. Supply line 4a and first interconnection frame 8 are connected by a via hole 5. Such a structure provides the same effects as the DRAM according to the first embodiment.

Third Embodiment

A third embodiment is directed to a solution of the following problem.

Figure 5:
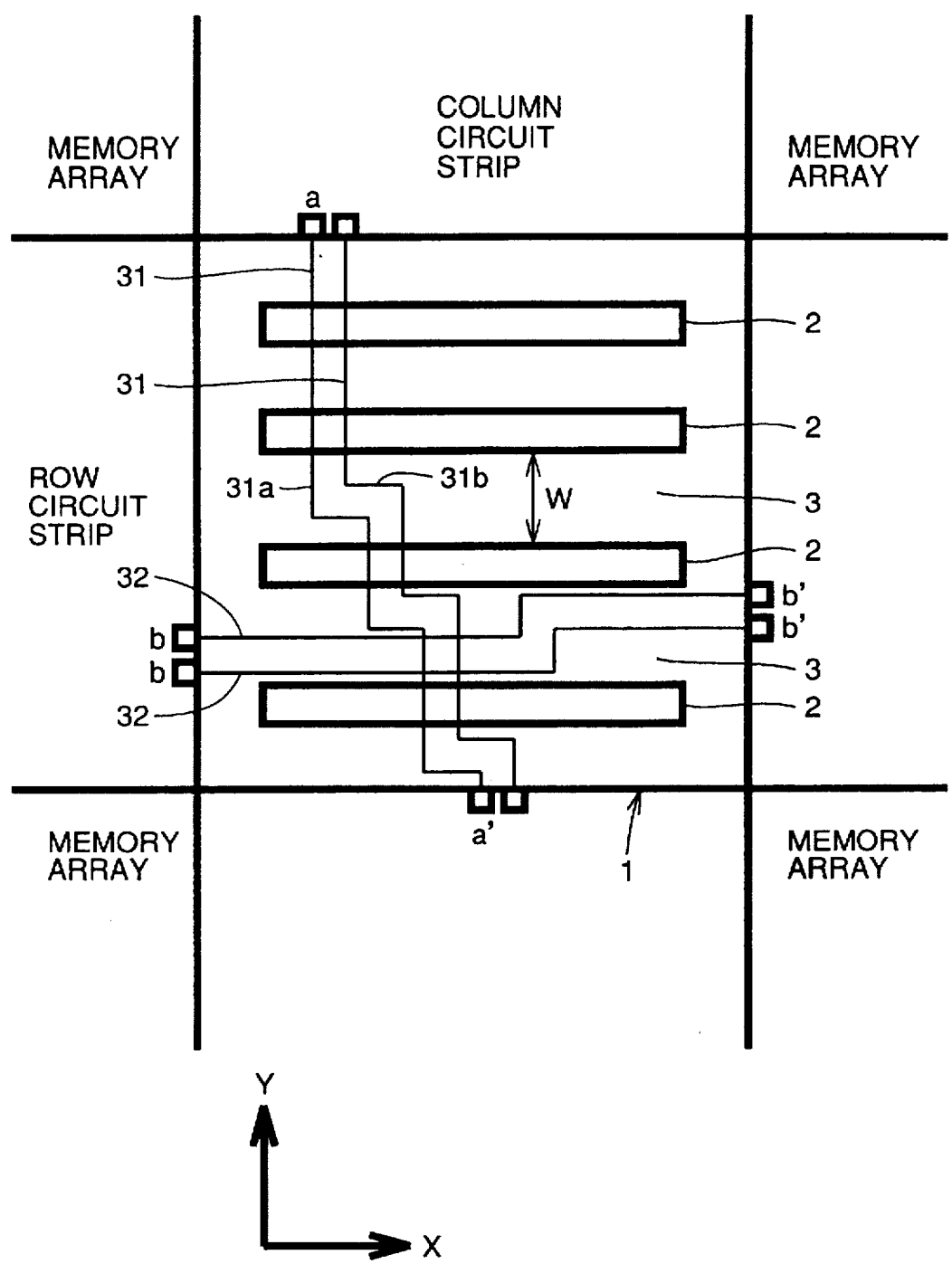
FIG. 5 is a diagram for use in illustration of problems associated with a conventional device, in order to describe a third embodiment of the invention.

FIG. 5 is a plan view showing a conventional central circuit strip. A circuit block 2 and an interconnection strip 3 are provided in central circuit strip 1. In the conventional DRAM, a signal interconnection 31 for connecting column address signal input/output terminals a and a' facing each other across central circuit 1 is produced winding as shown in the plan view. An interconnection 31a extending in the Y-direction is formed of a first interconnection, and an interconnection 31b extending in the X-direction is formed of a second interconnection. Interconnection 31 thus winds in the plan view, because the positions in the X-direction of column address signal input/output terminals a and a' facing each other are offset from each other. The winding portion is provided in interconnection strip 3. In the conventional device, the area of interconnection strip 3 should be larger than necessary (in other words width W must be large). Similarly, signal interconnection 32 connecting row address signal input/output terminals b and b' also winds. Signal interconnection 32 thus winds, because the positions in the Y-direction of row address signal input/output terminals b and b' are offset from each other.

Figure 6:
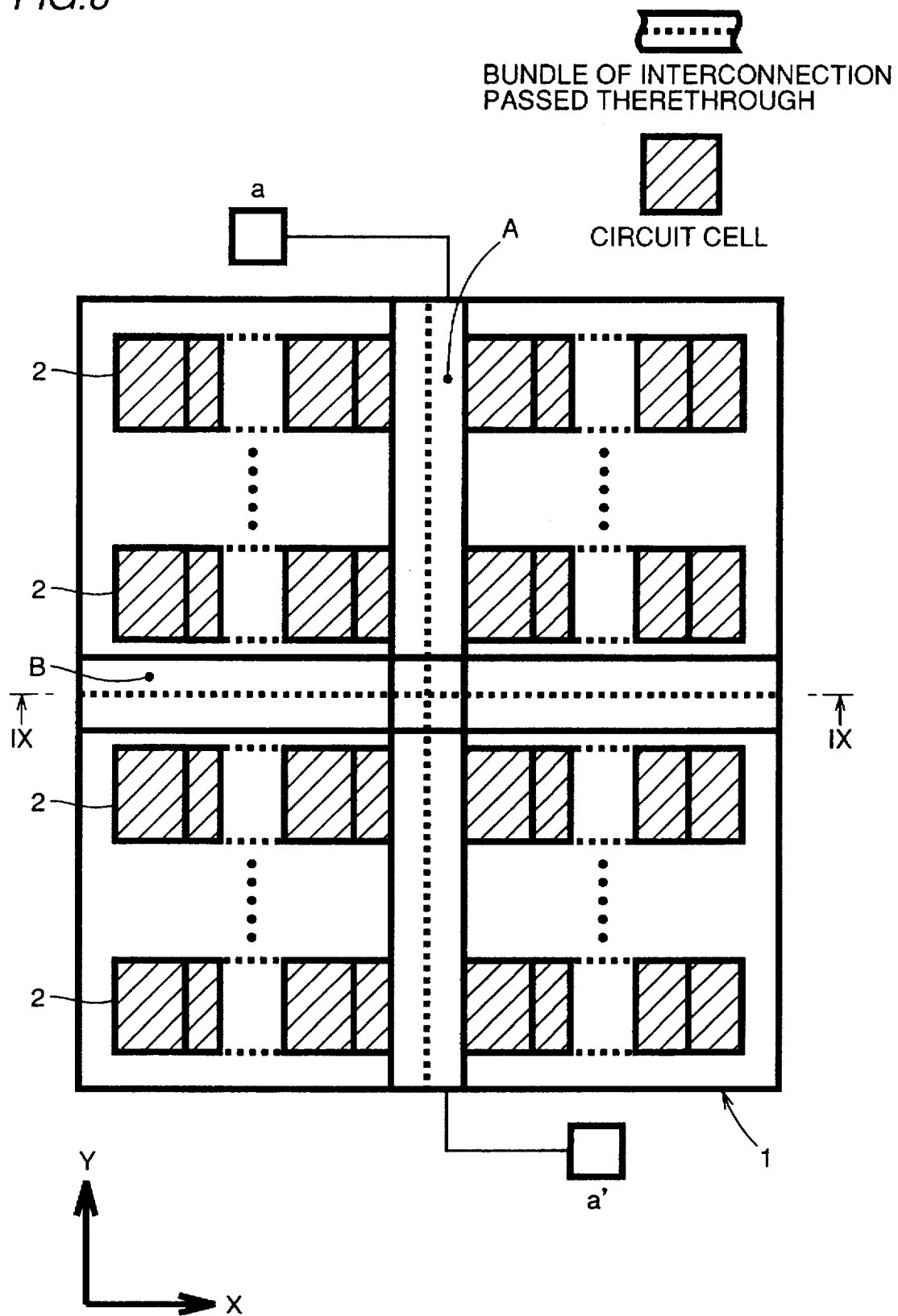
FIG. 6 is a plan view showing a central circuit strip in a DRAM according to the third embodiment of the invention.
Figure 7:
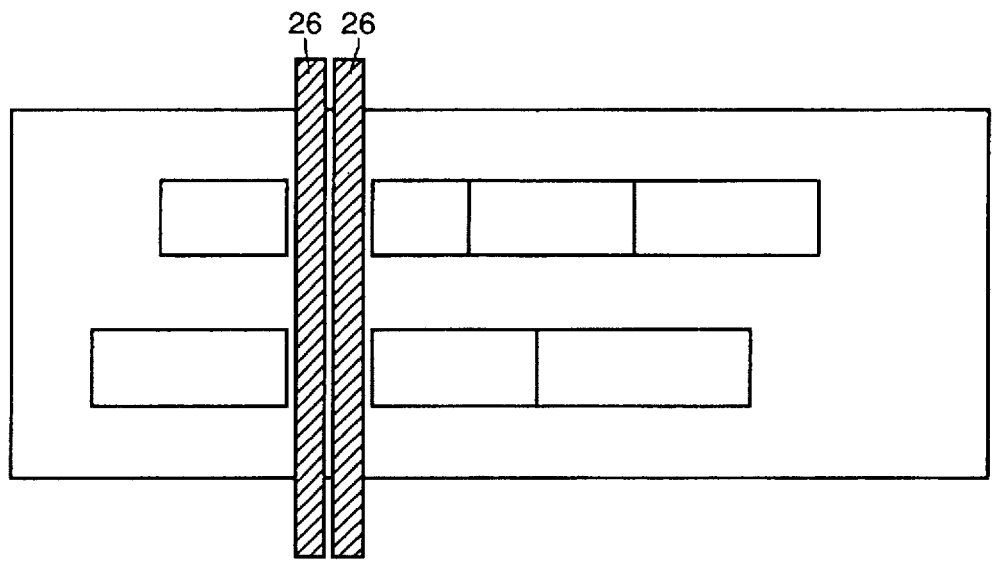
FIG. 7 is a view showing portion A in FIG. 6 being enlarged.
Figure 8:
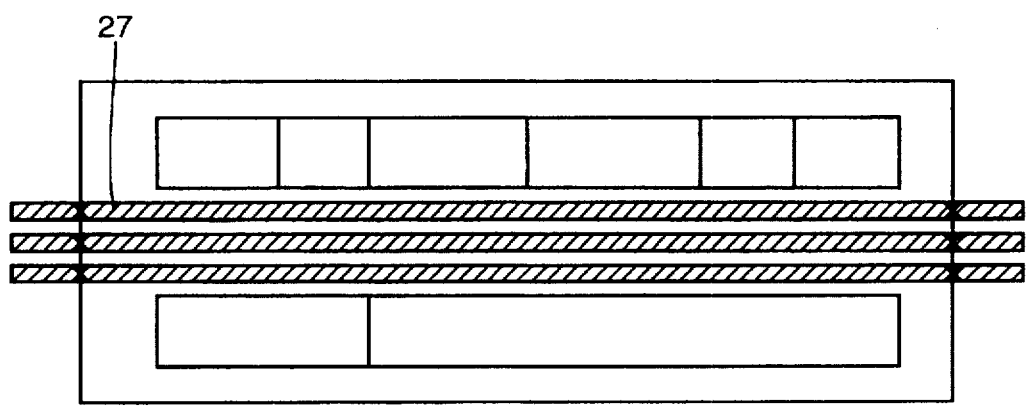
FIG. 8 is a view showing portion B in FIG. 6 being enlarged.
Figure 9:
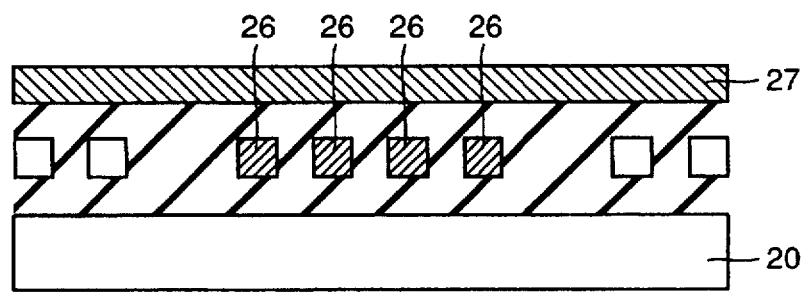
FIG. 9 is a cross sectional view taken along line IX—IX in FIG. 6.

FIG. 6 is a plan view showing a central circuit strip in a DRAM according to the third embodiment of the invention. FIG. 7 is a view showing portion A in FIG. 6 being enlarged. FIG. 8 is a view showing portion B in FIG. 6 being enlarged. FIG. 9 is a cross sectional view taken along line IX—IX in FIG. 6.

Referring to FIGS. 6 to 9, a bundle of signal lines 26 for the column circuit strip which connect terminals a and a' in different positions in the X-direction extend linearly in central circuit strip 1. A bundle of signal lines 27 for the row circuit strip also extend linearly as to cross the bundle of signal lines 26. Blocks 2 of circuit cells are arranged on both sides of the bundle of signal lines 26. Such a configuration reduces the area required by interconnection strips (not shown), and reduces the layout area of the central circuit strip.

Fourth Embodiment

Figure 10:
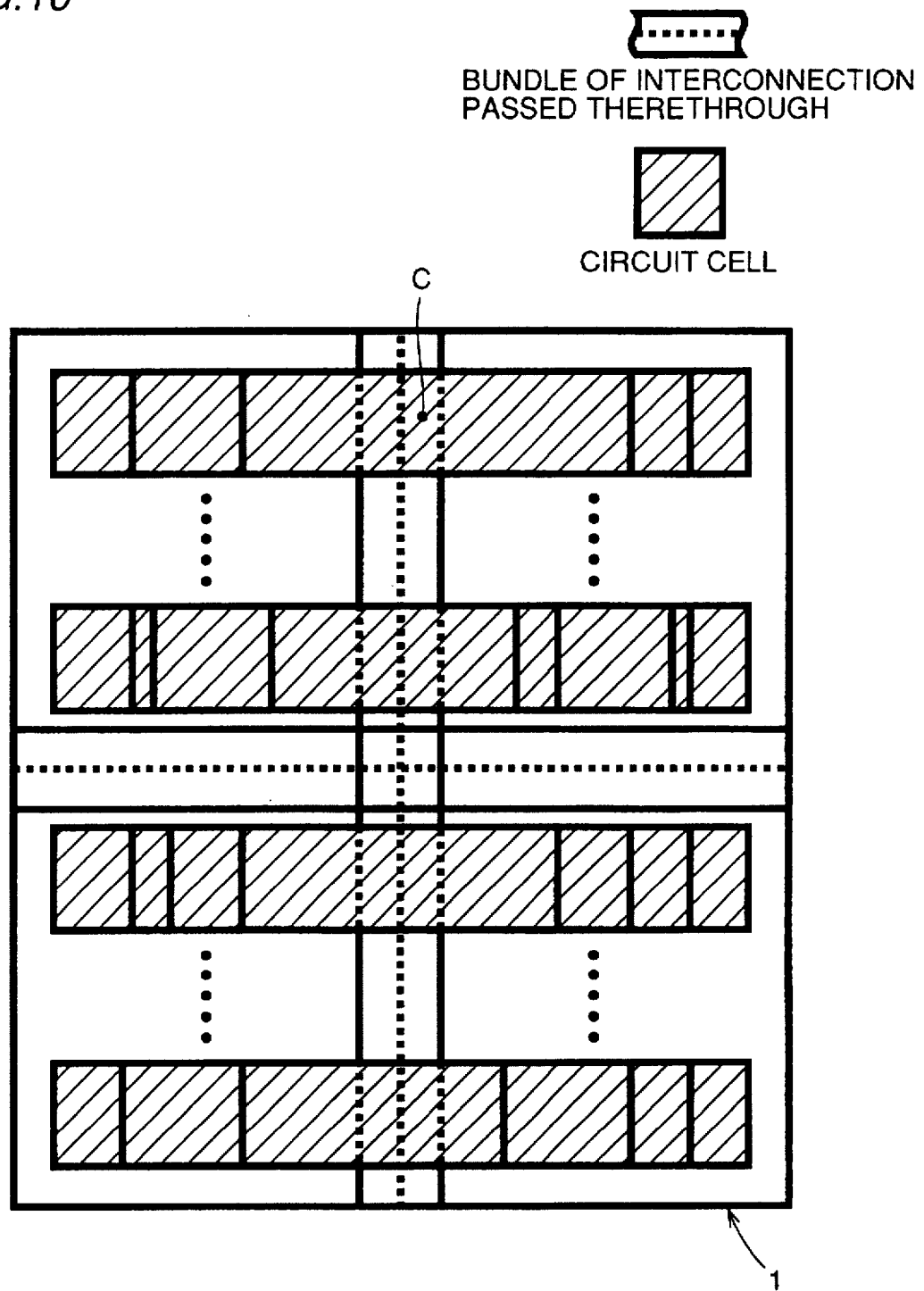
FIG. 10 is a plan view showing a central circuit strip in a DRAM according to a fourth embodiment of the invention.
Figure 11:
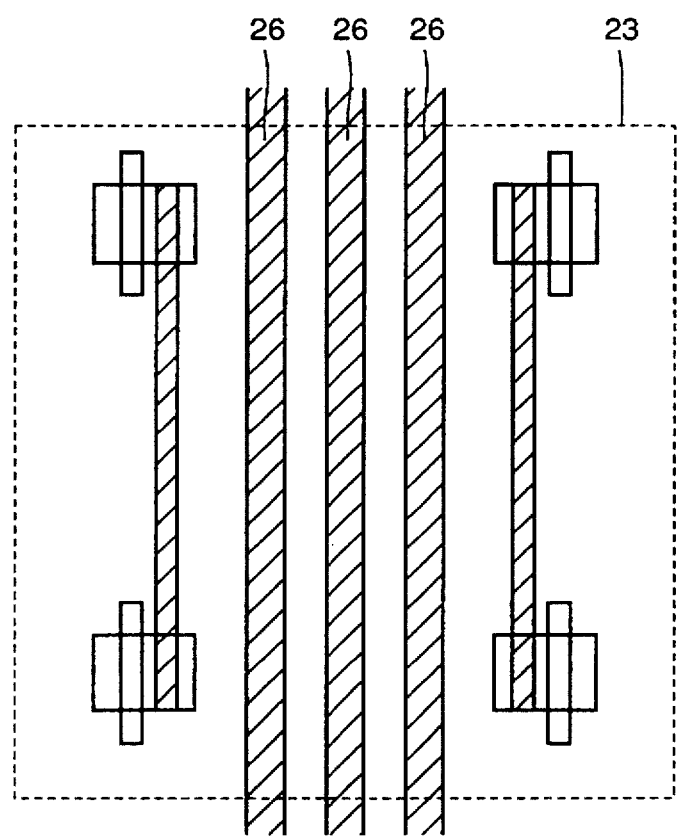
FIG. 11 is a view showing portion C in FIG. 10 being enlarged.
Figure 12:
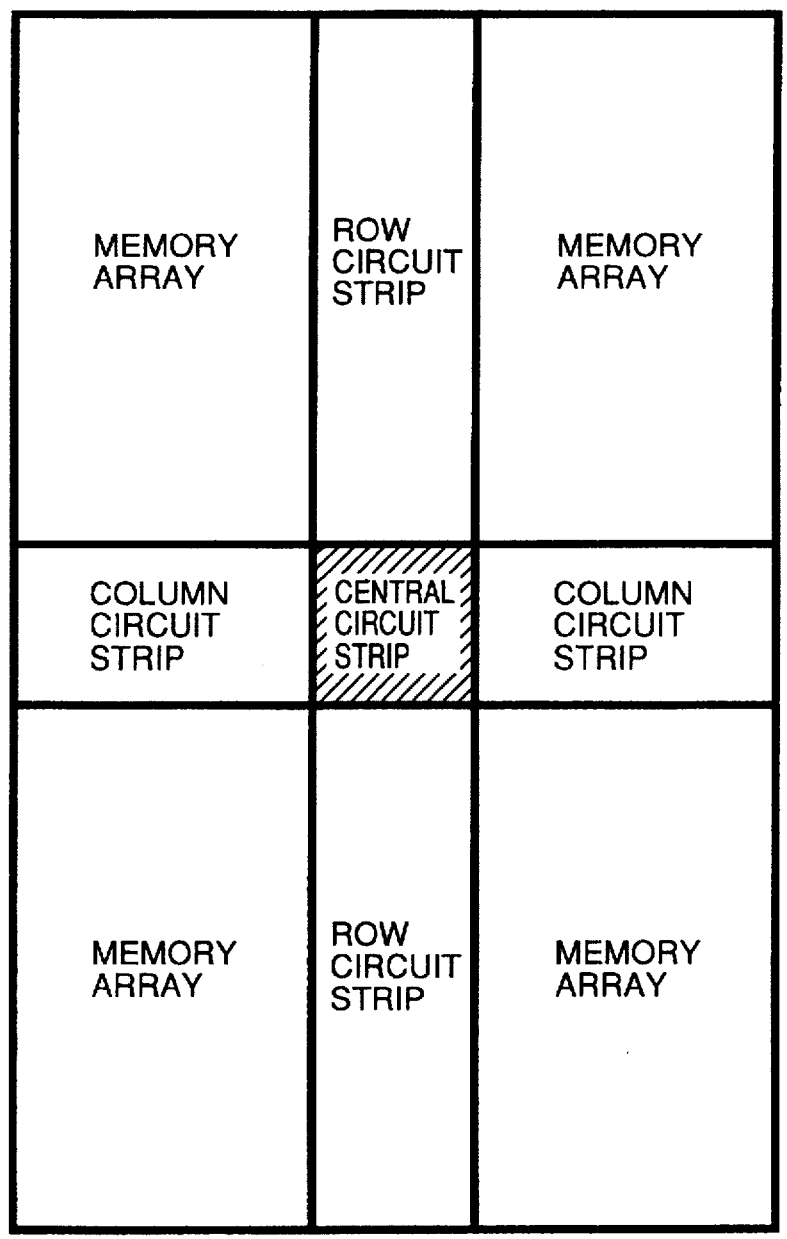
FIG. 12 is a plan view showing an entire DRAM.
Figure 13:
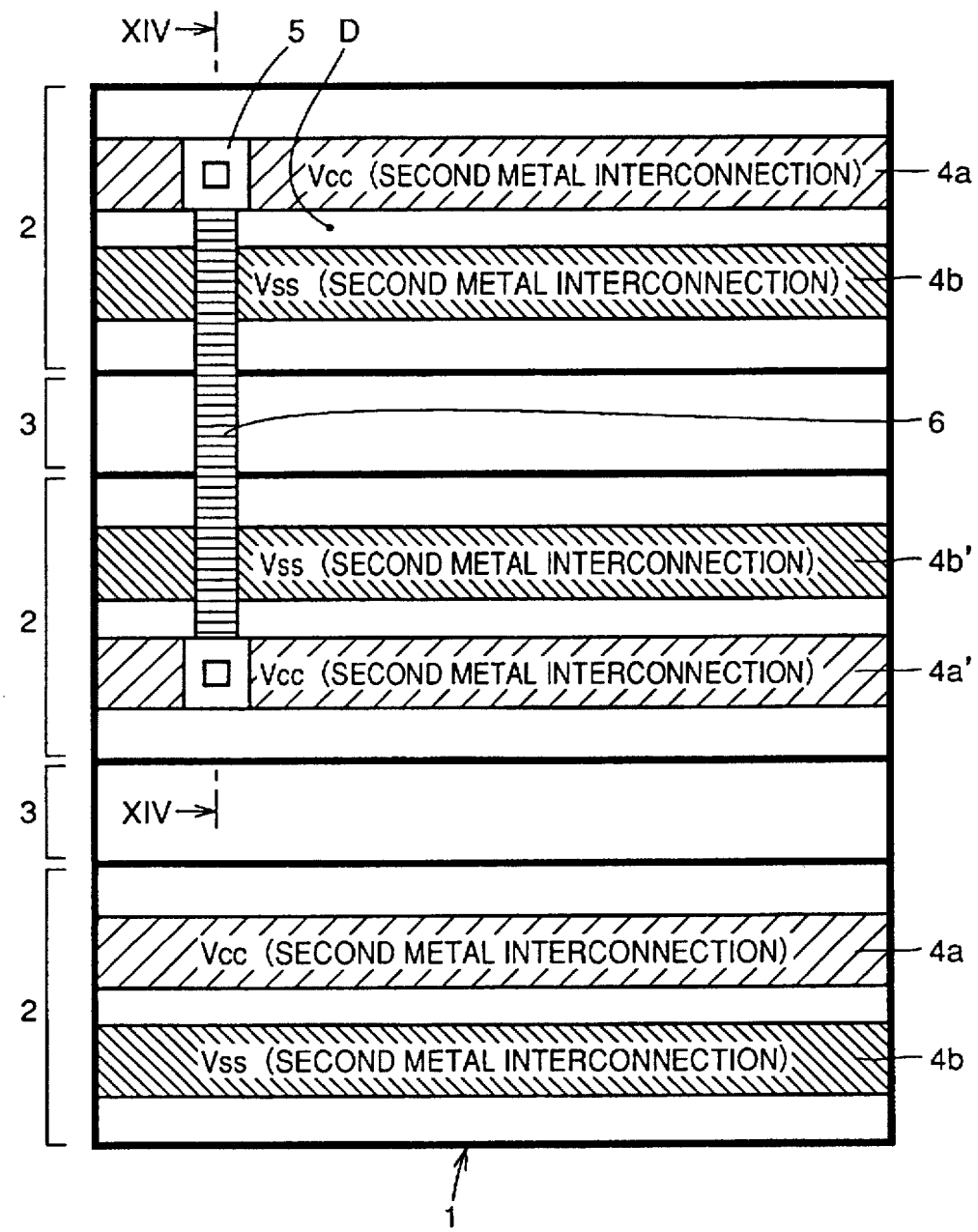
FIG. 13 is a plan view showing a central circuit strip in a conventional DRAM.
Figure 14:
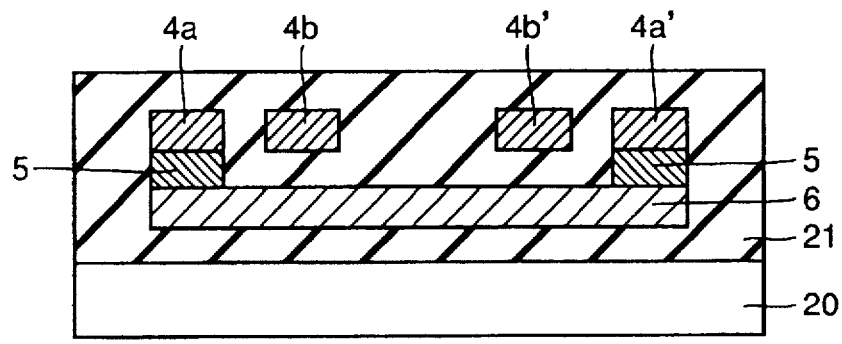
FIG. 14 is a cross sectional view taken along line XIV—XIV in FIG. 13.
Figure 15:
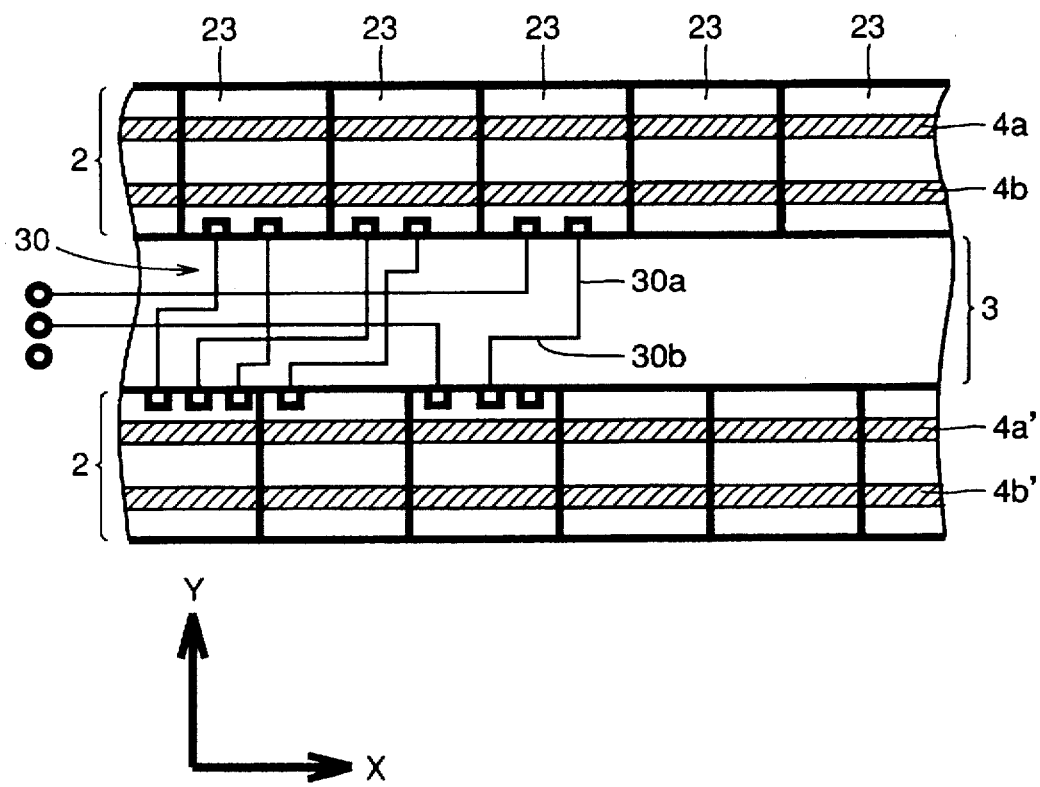
FIG. 15 is a view showing portion D in FIG. 13 being enlarged.

FIG. 10 is a plan view showing a central circuit strip in a DRAM according to a fourth embodiment of the invention. FIG. 11 is a view showing portion C in FIG. 10 being enlarged. In the fourth embodiment, the bundle of signal lines 26 for the column circuit strip is passed through an empty space portion provided in circuit cell 23. Such a configuration also reduces the area required for interconnection strips, and reduces the layout area of the central circuit strip.

In the semiconductor memory device according to the first aspect of the invention, the second interconnection frame may be used as a power supply line, and therefore the voltage levels of the power supply lines may advantageously be stabilized. In addition, the first interconnection frame may be used as a ground line, the voltage levels of the ground lines may advantageously by stabilized.

In the semiconductor memory device according to the second aspect of the invention, the second interconnection frame may be used as a ground line, the voltage levels of the ground lines may advantageously be stabilized. In addition, the first interconnection frame may be used as a supply line, and the voltage levels of the power supply lines may advantageously be stabilized.

In the semiconductor memory device according to the third aspect of the invention, a bundle of signal lines passed through the central circuit strip along the shorter side of the chip linearly extends, the area of interconnection strip may be reduced, and the layout area of the central circuit strip may advantageously be reduced.

In the semiconductor memory device according to the fourth aspect of the invention, a bundle of signal lines passed through the central circuit strip along the longer side of the chip extends linearly, and therefore the layout area of the central circuit strip may advantageously be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a central circuit strip at a crossing of a row circuit strip having an arrangement of circuit cells along a first side of a chip and provided between memory array blocks and a column circuit strip having an arrangement of circuit cells along a second side, shorter than the first side, of the chip and provided between memory array blocks and having at least two interconnection layers, wherein said central circuit strip includes:

a first interconnection frame provided on a semiconductor substrate to surround said central circuit strip along an edge of said central circuit strip, said first interconnection frame being formed of a first interconnection layer;

a second interconnection frame provided on said first interconnection frame with an insulating film therebetween to surround said central circuit strip along the edge of said central circuit strip, said second interconnection frame being formed of a second interconnection layer;

a supply line provided ins aid central circuit strip, formed of the second interconnection frame, and extending in parallel to an interconnection strip provided in said central circuit strip; and a ground line provided in said central circuit strip, formed of the second interconnection frame and extending in parallel to said supply line, both ends of said supply line being in contact with said second interconnection frame, a gap being provided between both ends of said ground line and said second interconnection frame in order to avoid electrical connection between them, said ground line and said first interconnection frame being connected, using a via hole provided ins aid insulating film.

2. A semiconductor memory device including a central circuit strip at a crossing of a row circuit strip and a column circuit strip, wherein said central circuit strip includes:

a semiconductor substrate;

a first interconnection frame provided on said semiconductor substrate to surround said central circuit strip along an edge of said central circuit strip, said first interconnection frame being formed of a first interconnection layer;

a second interconnection frame provided on said first interconnection frame with an insulating film therebetween to surround said central circuit strip along the edge of said central circuit strip, said second interconnection frame being formed of a second interconnection layer;

a supply line provided in said central circuit strip, formed of the second interconnection frame and extending in parallel to an interconnection strip provided in said central circuit strip; and a ground line provided in said central circuit strip, formed of the second interconnection frame and extending in parallel to said supply line, both ends of said ground line being in contact with said second interconnection frame, a gap being provided between both ends of said supply line and said second interconnection frame, in order to avoid electrical connection therebetween, said supply line and said first interconnection frame being connected, using a via hole provided in said insulating film.

* * * * *